United States Patent
Goebel et al.

[19]

[11] Patent Number: 6,044,009
[45] Date of Patent: Mar. 28, 2000

[54] DRAM CELL ARRANGEMENT AND METHOD FOR ITS PRODUCTION

[75] Inventors: Bernd Goebel; Wolfgang Roesner; Franz Hofmann; Emmerich Bertagnolli; Eve Marie Martin, all of Munich, Germany

[73] Assignee: Siemens Aktiengesellschaft, Munich, Germany

[21] Appl. No.: 09/274,733

[22] Filed: Mar. 23, 1999

[30] Foreign Application Priority Data

Mar. 23, 1998 [DE] Germany ............... 198 12 642

[51] Int. Cl.$^7$ ..................................... H01L 27/04
[52] U.S. Cl. ............... 365/149; 257/302; 257/906
[58] Field of Search ............... 365/149; 257/302, 257/905, 906

[56] References Cited

U.S. PATENT DOCUMENTS 4,462,040  7/1984  Ho et al. ............................ 257/302
4,630,088  12/1986  Ogura et al. .

FOREIGN PATENT DOCUMENTS 195 19 160   9/1996   Germany .

OTHER PUBLICATIONS

Sze, S.M. Semiconductor Devices, AT & T Bell Laboratories, Figure 18a, p. 487.
K. Yamada et al., "A Deep–Trenched Capacitor Technology for 4 MEGA Bit Dynamic RAM", Proc. Intern. Electronic Devices and Materials, IEDM 85, pp. 702–705.

*Primary Examiner*—Vu A. Le
*Attorney, Agent, or Firm*—Hill & Simpson

[57] ABSTRACT

A storage cell has a number of projections of a semiconductor substrate arranged in rows and columns, neighboring rows of the projections being translation-symmetrical in relation to a y-axis which extends parallel to the columns. Each of the projections has at least one first source/drain region of a selection transistor and one channel region arranged below the first source/drain region, which is surrounded by a gate electrode annularly. A storage capacitor is connected between the first source/drain region and a bit line. The bit line as well as the storage capacitor are arranged essentially above the semiconductor substrate. Second source/drain regions of selection transistors are buried in the semiconductor substrate and connected with each other. Word lines can be formed self-justified in the form of adjacent gate electrodes. The projections can be created by etching with only one mask. The storage cell can be produced with an area of $4F^2$, F being the minimal structural size that can be produced in the respective technology.

5 Claims, 3 Drawing Sheets

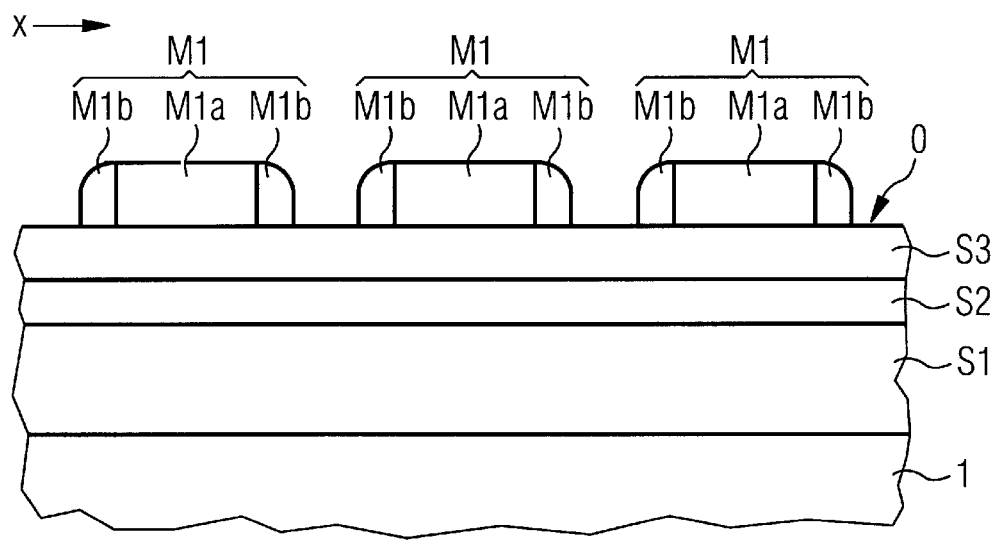
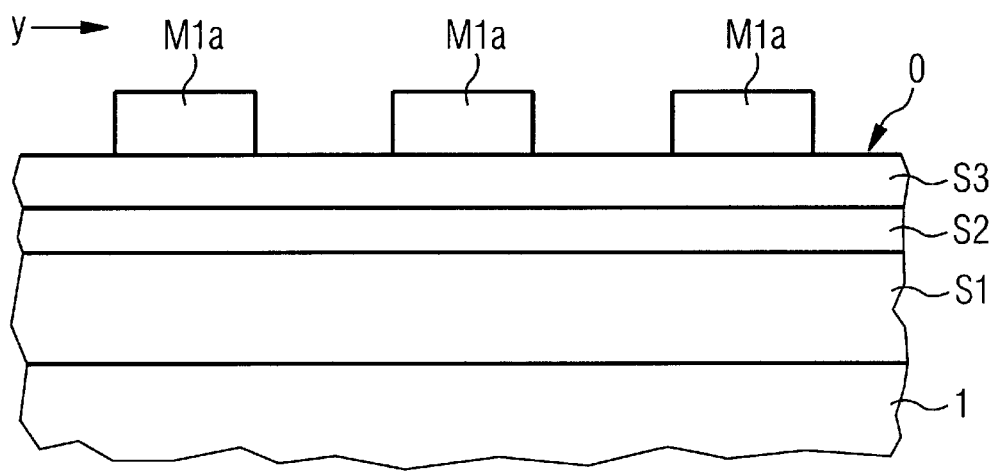

DRAM CELL ARRANGEMENT AND METHOD FOR ITS PRODUCTION

BACKGROUND OF THE INVENTION

1. Field of the Invention

The invention relates to a DRAM cell arrangement and a method for its production. More particularly, the invention relates to a vertically structured DRAM cell arrangement.

2. Description of the Related Art

In DRAM cell arrangements, i.e. memory cell arrangements with dynamic random access, what are known as single transistor memory cells are used almost exclusively. A single transistor memory cell comprises a selection transistor and a storage capacitor. The information is stored in the storage capacitor in the form of an electrical charge representing a logical quantity of 0 or 1. By activating the selection transistor via a word line, the information can be read out via a bit line.

Usually, a first source/drain region of the selection transistor is connected to the storage capacitor, and a second source/drain region of the selection transistor is connected to the bit line. A gate electrode of the selection transistor is connected to the word line (cf. e.g. S.M.Sze Semiconductor Devices, AT&T Bell Laboratories, Murray Hill, N.J. 1985, p. 487, FIG. 18a).

Since the memory density increases from generation to generation, the surface of the single transistor memory cell must be reduced from generation to generation. As such, reducing the dimensions of the memory cell is limited by the minimal structural size ▭that can be produced in the respective technology. In addition, the memory cell may be altered. Thus, up to the 1MBit generation, both the selection transistor and the storage capacitor were realized as planar components. Since the 4MBit memory generation, a further surface reduction has had to occur by means of a three-dimensional arrangement of the selection transistor and storage capacitor.

One option is to design the storage capacitor in a trench instead of in a planar fashion (see K. Yamada, "A deep trenched Capacitor technology for 4 Mbit DRAMs", Proc. Intern. Electronic Devices and Materials IEDM 85, p. 702). However, the creation of such a buried storage capacitor is expensive. Also, capacitor dielectrics with high dielectricity constants cannot be used, since their deposition is only possible in essentially planar surfaces.

German Patent Document No. 195 19 160 C1 proposes a DRAM cell arrangement in which the storage capacitor is created over the selection transistor, and the bit line is buried in the substrate. Since the storage capacitor is created at a surface of the substrate, capacitor dielectrics with high dielectric constants can be used. Each memory cell has a protuberant semiconductor structure having a first source/drain region. A channel region is positioned underneath the first source/drain region and a second source-drain region is positioned underneath the channel region. The protuberant semiconductor structure is surrounded annularly by a gate electrode.

Semiconductor structures of memory cells are arranged in rows and columns. Neighboring rows of the semiconductor structures are translation-symmetrical in relation to an axis extending parallel to the columns. In order to create word lines in a self-justified fashion, i.e. without using masks that need to be justified, the intervals between semiconductor structures that are arranged along the columns are smaller than intervals between semiconductor structures that are arranged along the rows. The semiconductor structures are surrounded by a grid-shaped depression. The word lines emerge by the deposition and etchback of conductive material in the form of gate electrodes that are situated adjacently along the columns. The buried bit line is created from a doped layer, which is structured in a strip-shaped fashion by trenches filled with insulating material. The trenches are created with the aid of a strip-shaped first mask.

With the aid of a strip-shaped second mask, whose strips extend perpendicular to the trenches, depressions are created between the trenches by the etching of semiconductor material. The depressions do not cut through the doped layer, so as not to cut through the bit line. The semiconductor structures emerge from a layer sequence by the creation of the trenches and the depressions. The depressions are also filled with insulating material. The insulating material is subsequently etched back, the semiconductors are thereby exposed and the grid-shaped depression emerges. Due to the common etching of the insulting material in the depressions and of the insulating material in the trenches, the floor of the grid-shaped depression is flat, which is essential for the self-justified creation of the word lines.

To increase the packing density, the first mask is created in that strips having a width F are first created by a photolithographic process. The strips are widened by the deposition and etchback of material. A distance between neighboring strips of the first mask is thus less than F. The strips of the second mask are created with the width F, by reason of which the above cited conditions regarding the distances between the semiconductor structures are satisfied. The memory cell's surface area is $4F^2$. The first source/drain region acts as the first capacitor electrode of the storage capacitor. A second capacitor electrode is created by the whole-surface deposition of conductive material over the capacitor dielectric.

In U.S. Pat. No. 4,630,088 it is suggested that the storage capacitor be connected between a first source/drain region of the selection transistor and the bit line. Each memory cell has a protuberant semiconductor structure which is surrounded by a gate electrode annularly. The memory cells are arranged off-set to one another diagonally with respect to a word line direction. The storage capacitor includes the first source/drain region, a part of a whole-surface-deposited capacitor dielectric, and a part of the bit line. The first source/drain region, a channel region and a second source/drain region of the selection transistor are arranged above one another in layers.

SUMMARY OF THE INVENTION

The invention is based on the problem of proposing a DRAM cell arrangement which, given a high packing density, can be produced with a smaller processing outlays than previously available. A production method for such a DRAM cell arrangement is also proposed. in an inventive DRAM cell arrangement, a semiconductor substrate includes a number of projections arranged in rows and columns. Neighboring rows of the projections are translation-symmetrical in relation to a y-axis which extends parallel to the columns. Each projection has at least one first source/drain region and one channel region of a vertical selection transistor, the channel region being arranged under the first source/drain region. The projection can also have a second source/drain region of the selection transistor. The projection is provided with a gate dielectric at least in the area of the channel region. Each of the projections is surrounded annularly by a gate electrode of the selection transistor. A word line is formed by gate electrodes which neighbor one another along an x-axis parallel to the rows and which are situated adjacently. A first capacitor electrode of the storage capacitor is electrically connected to the first source/drain region. The first capacitor electrode is cut in two by a capacitor dielectric of a second capacitor electrode of the storage capacitor, which is arranged over the first capacitor electrode. The second capacitor electrode is electrically connected to a bit line which extends essentially parallel to the columns. The storage capacitor is connected between the first source/drain region and the bit line. The second source/drain region is buried in the semiconductor substrate.

In order to connect the second source/drain regions of selection transistors to a common potential, it is advantageous to connect at least a few of them to each other.

Since the second source/drain regions are not connected to bit lines, they can be parts of a continuous layer which does not need to be -structured. A mask is not necessary for the creation of the second source/drain regions, which reduces the processing outlay.

Since not only the bit line, but also the storage capacitor is created at a surface of the semiconductor substrate, the creation of structures that are buried in the semiconductor substrate is avoided, which also reduces the processing outlay.

The utilization of capacitor dielectrics with high dielectric constants is possible, since the storage capacitor is not created in a deep trench.

An advantage of the inventive memory cell arrangement is that a-particles which emerge in the semiconductor substrate reach the bit line, which is arranged at the surface of the semiconductor substrate, and the storage capacitor having only a low probability, so that the probability of falsifying information is therefore low.

The projections are preferably created by a structuring of a layer sequence. To this end, a first layer which is doped by a first conductivity type is created; a second layer which is doped by a second, opposite conductivity type is created over this layer; and a third layer which is doped by the first conductivity type is created over the second layer. The first layer, the second layer, and the third layer can be created by implantation of the semiconductor substrate and/or by epitaxy which is doped in situ. If a layer is created by epitaxy doped in situ, then the semiconductor substrate is enlarged by this layer.

To simplify the processing, it is advantageous if the projections are created by etching with only one mask. A grid-shaped depression is thus created which is divided at least by the third layer and the second layer. Thus, all the vertical dimensions of each projection—i.e. perpendicular to the semiconductor substrate—are equal. In other words, all the sides of each projection have the same length perpendicular to the semiconductor substrate. Alternatively, parallel first trenches can be created in a first (etching) step, and second trenches, which extend transversely to the first trenched, can be created in a second (processing) step.

First source/drain regions of the selection transistors emerge from the third layer as parts of the projections, and channel regions of the selection transistors emerge from the second layer. The grid-shaped depression or the first trenches and the second trenches reach into the first layer. The second source/drain regions are parts of the first layer.

To simplify the processing, it is advantageous to produce the grid-shaped depression or the first trenches and the second trenches optimally flat in that the first layer is not divided.

To simplify the processing, it is advantageous if the word lines are created self-justified. Self-justified creation is possible, for example, if intervals between projections which are arranged along the columns and are parallel to the column direction, are greater than intervals between projections which are arranged along the rows and Eire parallel to the row direction. To create the word lines, conductive material is deposited in a conformal fashion, whereby a wave-shaped conductive layer emerges. Valleys of the waves of the conductive layer extend parallel to the rows. The conductive material fills the space between the projections which are arranged along the rows, while it does not fill the space between the projections which are arranged along the columns. The conductive layer is etched back anisotropically until parts of the conductive layer which are arranged above the first source/drain regions and between the neighboring projections along the columns are removed. Thus, the word lines emerge from the conductive layer. The word lines are not connected in the column direction. Since the conductive material fills the space between the projections which are arranged along the rows, there is relevant conductive material between the projections which are arranged along the rows even subsequent to the etchback of the conductive material. At the sides of the projections which are parallel to the direction of the rows, the word lines or the gate electrodes take the form of spacers.

To increase the packing density, it is advantageous if the distances between the projections which are arranged along the rows are smaller than F. To create the projections, a mask can be used which is enlarged by spacers in the row direction. For example, first parts of the mask are created in that material is deposited and structured by a strip-shaped first mask made of photosensitive resist, the strips of which extend parallel to the columns. Additional material is subsequently deposited and etched back, whereby spacer-shaped second parts of the mask emerge at the sides of the first parts of the mask. The first parts and the second parts of the mask are structured with the aid of a strip-shaped second mask made of photosensitive resist, the strips of which extend parallel to the rows, whereby the mask emerges. The widths of the strips of the first and second photosensitive resist masks as well as the distances between the strips of the first photosensitive resist mask and the distances between the strips of the second photosensitive resist mask are preferably equal to F. The described steps guarantee that the intervals between the projections which are arranged along the rows; are smaller than the intervals between the projections which are arranged along the columns.

To simplify the processing it is advantageous if the first source/drain region coincides with the first capacitor electrode. Alternatively, the first capacitor electrode is created over the first source/drain region by the structuring of an additional conductive layer, for example.

To simplify the processing, it is advantageous if the second capacitor electrode is part of the bit line. To this end, conductive material can be deposited over the capacitor dielectric and structured in a strip-shaped fashion.

To enlarge the signal of the storage capacitor, it is advantageous if the capacitor dielectric is created from a material with a high dielectric constant, such as perovskite (e.g. $Ba_xSr_{1-x}TiO_3$, $SrBi_2Ta_2O_9$, $PbZrTiO_3$) or $Ta_2O_5$. Since such materials are preferably deposited on flat surfaces, it is advantageous to create an insulating structure subsequent to the creation of the gate electrodes in that insulating material is deposited and planarized until the first source/drain regions are exposed. The capacitor dielectric is then deposited over the first source/drain regions, which act as first capacitor electrodes.

The semiconductor substrate is a silicon substrate or an SOI substrate.

BRIEF DESCRIPTION OF THE DRAWINGS

FIG. 1A is a cross-sectional view of a substrate, subsequent to the creation of a first layer, a second layer, a third layer, first parts of a mask and second parts of the mask.

FIG. 1B is a cross-sectional view of the substrate which is perpendicular to the cross-section in FIG. 1A, subsequent to the processing steps in FIG. 1A.

DETAILED DESCRIPTION OF THE PREFERRED EMBODIMENTS

The starting material is a substrate 1 of silicon, which is p-doped and has a dopant concentration of approximately $10^{17}cm^{-3}$. An n-doped first layer S1 which is approximately 500 nm thick is created by epitaxy doped in situ. The dopant concentration of the first layer S1 is about $10^{20}cm^{-3}$. A p-doped second layer S2 which is approximately 200 nm thick is created by epitaxy doped in situ. The dopant concentration of the second layer S2 is about $3\times10^{17}cm^{-3}$. An n-doped third layer S3 which is approximately 200 nm thick is created by epitaxy doped in situ. The dopant concentration of the third layer S3 is about $10^{21}cm^{-1}$ (FIGS. 1A and 1B). The substrate is enlarged by the first layer S1, the second layer S2 and the third layer S3. A y-axis y and an x-axis x, which is perpendicular to the y-axis y, extend along a surface O of the substrate 1.

Figure 4:
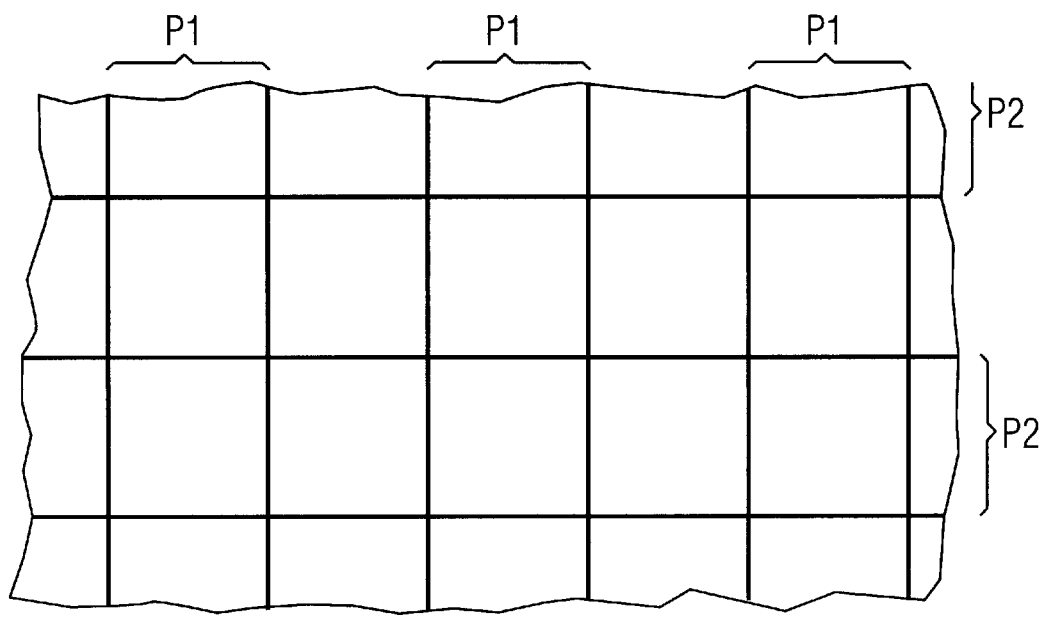
FIG. 4 is a plan view of the substrate in which the positions of a first and second mask made of photosensitive resist are illustrated.

To create a mask M1, silicon dioxide $SiO_2$ is deposited in a thickness of about 100 nm in a TEOS ("tetra-ethoxy-silane") process. $SiO_2$ is structured into strips with the aid of a strip-shaped first mask P1 made of photosensitive resist (FIG. 4)—whose strips extend parallel to the y-axis y, comprise a width of about 250 nm and have a distance of about 250 nm from one another—whereby first parts M1 a of the mask M1 emerge. Subsequent to removal of the first mask made of photosensitive resist P1, $SiO_2$ is deposited in a thickness of about 80 nm and etched back, whereby spacers parts M1b of the mask M1 emerge in the form of spacers along sides of the first parts M1 a of the mask M1 (FIGS. 1A and 1B). A suitable etching agent is $CHF_3+O_2$, for example.

$SiO_2$ is etched with the aid of a strip-shaped second photosensitive resist mask P2 (FIG. 4)—whose strips extend parallel to the x-axis x, have a width of about 250 nm, and have a distance from each other of about 250 nm—whereby the first parts M1a and the second parts M1b of the mask M1 are further structured. The mask M1 thus emerges (FIGS. 1A and 1B).

Figure 2A:
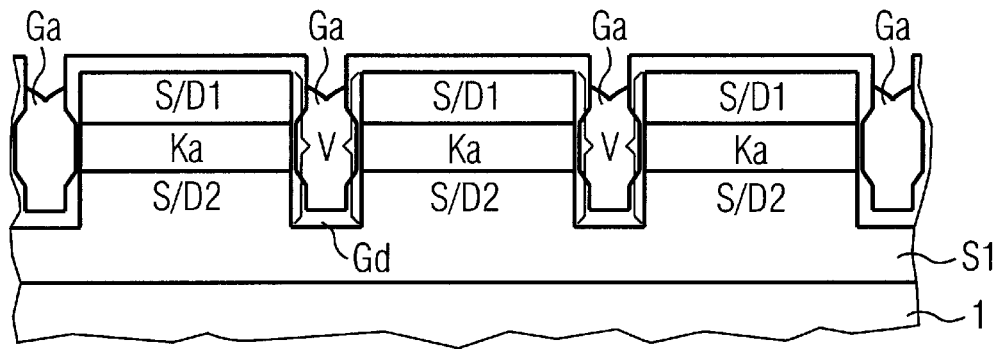
FIG. 2A is a cross-sectional view of the substrate in FIG. 1A, subsequent to the creation of projections, first source/drain regions, channel regions, second source/drain regions, a gate dielectric, gate electrodes and word lines.
Figure 2B:
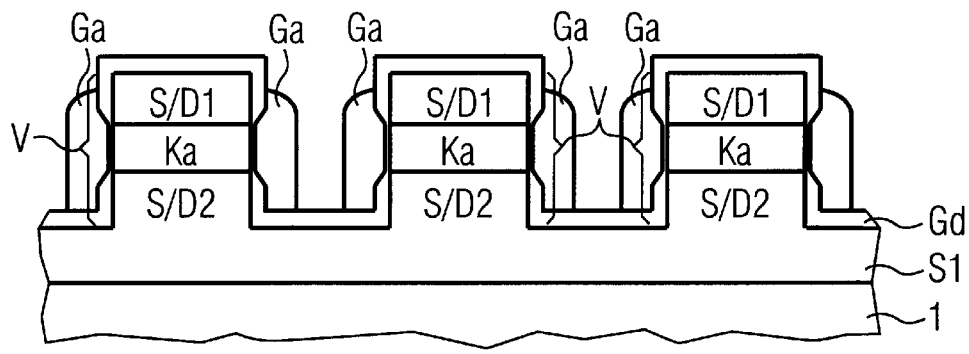
FIG. 2B is a cross-sectional view of the substrate in FIG. 1B subsequent to the processing steps from FIG. 2A.

Subsequent to the removal of the second photosensitive resist mask P2, silicon is etched 600 nm deep with $HBr+NF_3+He+O_2$, dividing the third layer S3 and the second layer S2. Cuboidal projections V emerge from the substrate 1, the distances of said projections from one another being smaller in the direction of the x-axis x than in the direction of the y-axis y. The projections V are surrounded by a grid-likes depression. As parts of the projections, first source/drain regions S/D1 of vertical selection transistors emerge from the third layer S3, and channel regions Ka emerge from the second layer S2. Parts or the first layer S1 which are arranged beneath the channel regions Ka act as second source/drain region S/D2 (FIGS. 2A and 2B). The mask M1 is removed by etching with $CHF_3$ and $O_2$, for example.

To create a gate dielectric Gd, $SiO_2$ is grown in a thickness of about 5 nm by thermal oxidation.

To create a first conductive layer, polysilicon which has been n-doped in situ is deposited in a thickness of about 80 nm. The first conductive layer is waved, the waves, i.e. their peaks and valleys, extend parallel to the x-axis x. The first conductive layer fills the space between the projections V which are arranged along the x-axis x, while they do not fill the space between the projections V which are arranged along the y-axis y. Polysilicon is etched back about 150 nm deep by etchback with $C_2F_6+O_2$, for example, exposing parts of the gate dielectric Gd on the first source/drain regions S/D1 and parts of the gate dielectric Gd between the projections V which are arranged along the y-axis y. The first conductive layer is thus structured in the form of spacers at sides of the projections V which are parallel to the x-axis x. Gate electrodes Ga emerge from the first conductive layer. The gate electrodes surround the projections V annularly. Neighboring gate electrodes Ga along the x-axis x are adjacent and form word lines. The word lines extend parallel to the x-axis x (FIGS. 2A and 2B).

Figure 3A:
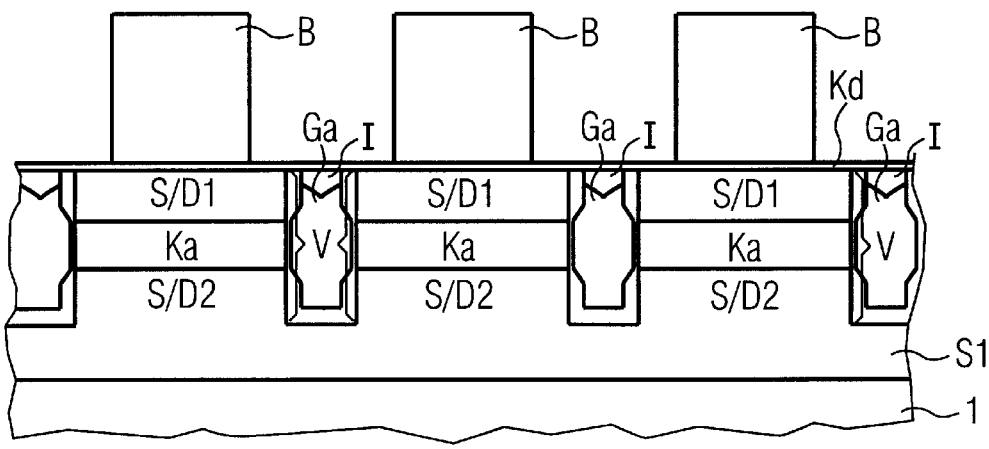
FIG. 3A is the cross-sectional view of the substrate in FIG. 2A, subsequent to the creation of an insulating structure, a capacitor dielectric and bit lines.
Figure 3B:
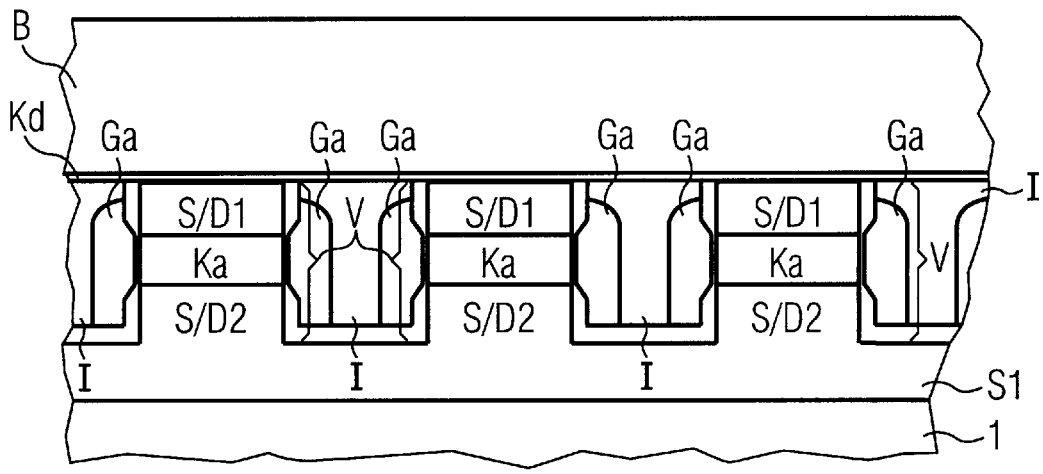
FIG. 3B is a cross-sectional view of the substrate in FIG. 2B, subsequent to the processing steps from FIG. 3A.

To create an insulating structure 1, $SO_2$ is deposited in a thickness of about 300 nm in a TEOS process and planarized by chemical-mechanical polishing, until the first source/drain regions S/D1 are exposed (see FIGS. 3A and 3B).

A capacitor dielectric Kd is subsequently created in that barium strontium titanate is deposited whole-surface in a thickness of about 20 nm (FIGS. 3A and 3B).

A second conductive layer is created by the deposition of AlSiCu in a thickness of about 200 nm. AlSiCu is etched with $BCl_3+Cl_2+CH_4$, for example, with the aid of a strip-shaped photosensitive resist mask whose strips extend parallel to the y-axis y, bit lines B being created from the second conductive layer. The bit lines B have a width of about 250 nm, and the distances between neighboring bit lines B are about 250 nm (FIG. 3A and 3B). The first source/drain regions S/D1 act as first capacitor electrodes of storage capacitors. Parts of the bit lines B which are arranged above the first source/drain regions S/D1 act as second capacitor electrodes of the storage capacitors.

The projections V are arranged in rows and columns. The x-axis x points in the row direction, and the y-axis y points in the column direction. Neighboring rows of the projections V are translation-symmetrical with respect to the y-axis y. Neighboring columns of the projections V are translation-symmetrical with respect to the x-axis x.

There are many conceivable variations of the exemplifying embodiment within the framework of the invention. In particular, the dimensions of the described layers, projections, masks, spacers and bit lines can be arbitrarily adapted to the respective requirements. The same applies to the proposed dopant concentrations.

Other materials can also be used for the capacitor dielectric. For example, an ONO layer 10 mm thick can be created in that an SiO$_2$ layer is created by thermal oxidation and silicon nitride is deposited over this, which is partly oxidized by thermal oxidation. A different conductive material can be used for the bit line, such as polysilicon doped in situ.

Also, the conductivity types of the doped layers can be reversed. For example, the substrate can be n-doped.

It should be understood that various changes and modifications to the presently preferred embodiments described herein will be apparent to those skilled in the art. Such changes and modifications may be made without departing from the spirit and scope of the present invention and without diminishing its attendent advantages. It is, therefore, intended that such changes and modifications be covered by the appended claims.

What is claimed is:

1. A DRAM cell arrangement, comprising:
    a semiconductor substrate having a plurality of projections forming rows and columns on said semiconductor substrate neighboring rows of the projections being translation-symmetrical relative to a y-axis extending parallel to the columns;
    at least one first source/drain region and a channel region of a selection transistor being arranged in each of the plurality of projections, said channel region being arranged under said source/drain region;
    a gate dielectric in the channel region;
    a gate electrode of the selection transistor surrounds each of the plurality of projections; annularly, in which the neighboring gate electrodes of selection transistors along an x-axis, extending parallel to the rows, are adjacently situated and form a word line;
    at least one second source/drain region of the selection transistors is buried in the semiconductor substrate,
    a first capacitor electrode of a storage capacitor being electrically connected to the at least one first source/drain region; and
    a second capacitor electrode of the storage capacitor being separated from the first capacitor electrode by a capacitor dielectric, the second capacitor electrode being arranged over the first capacitor electrode and electrically connected to a bit line which extends essentially parallel to the y-axis.

2. The DRAM cell arrangement of claim 1, wherein each of the plurality of projections has vertical dimensions perpendicular to the x-axis and the y-axis and each of said vertical dimensions are the same length.

3. The DRAM cell arrangement of claim 1, wherein a first plurality of intervals are formed between each of the plurality of projections along the rows parallel to the x-axis and a second plurality of intervals are formed between each of the plurality of projections arranged along the columns parallel to the y-axis, said first plurality of intervals having dimensions that are smaller than the corresponding dimensions of said second plurality of intervals.

4. The DRAM cell arrangement of claim 1, wherein the first source/drain region is the first capacitor electrode.

5. The DRAM cell arrangement of claim 1, wherein the second capacitor electrode is part of the bit line.

* * * * *